United States Patent [19]

Wojnarowski et al.

[11] Patent Number: 5,144,407
[45] Date of Patent: Sep. 1, 1992

[54] SEMICONDUCTOR CHIP PROTECTION LAYER AND PROTECTED CHIP

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 561,216

[22] Filed: Jul. 31, 1990

Related U.S. Application Data

[63] Continuation of Ser. No. 374,889, Jul. 3, 1989, abandoned.

[51] Int. Cl.⁵ ............................................. H01L 29/34
[52] U.S. Cl. ..................................... 357/54; 357/52; 357/71; 357/72
[58] Field of Search .................... 357/72, 52, 71, 79, 357/54; 437/211; 156/295, 299, 356, 578

[56] References Cited

U.S. PATENT DOCUMENTS

| | | | |
|---|---|---|---|
| 3,615,913 | 10/1971 | Shaw | 357/79 |
| 3,930,919 | 1/1976 | Chant et al. | 156/295 |
| 4,327,369 | 4/1982 | Kaplan | 357/72 |
| 4,331,970 | 5/1982 | Yerman | 357/72 |
| 4,388,128 | 6/1983 | Ogawa et al. | 156/295 |
| 4,388,132 | 6/1983 | Hoge et al. | 437/211 |
| 4,499,149 | 2/1985 | Berger | 357/65 |
| 4,571,322 | 2/1986 | Eichelberger et al. | 264/154 |
| 4,632,798 | 12/1986 | Eickman et al. | 357/72 |
| 4,652,598 | 3/1987 | Edelman | 524/99 |
| 4,701,999 | 10/1987 | Palmer | 437/211 |
| 4,714,516 | 12/1987 | Eichelberger et al. | 156/628 |
| 4,758,875 | 7/1988 | Fujisaki et al. | 357/54 |
| 4,783,695 | 11/1988 | Eichelberger | 357/65 |
| 4,823,234 | 4/1989 | Konishi et al. | 357/71 |
| 4,933,042 | 6/1990 | Eichelberger et al. | 156/239 |
| 4,990,993 | 2/1991 | Tsurumaru | 357/71 |

FOREIGN PATENT DOCUMENTS

| | | | |
|---|---|---|---|
| 52-58469 | 5/1977 | Japan | 357/72 |
| 55-150259 | 11/1980 | Japan | 357/54 |
| 58-093359 | 6/1983 | Japan | 357/54 |
| 61-168944 | 7/1986 | Japan | 357/72 |
| 62-061042 | 3/1987 | Japan | 357/72 |
| 62-099796 | 4/1987 | Japan | 357/72 |
| 1-100928 | 4/1989 | Japan | 156/356 |
| 88/02552 | 7/1988 | PCT Int'l Appl. | 357/71 |

OTHER PUBLICATIONS

Makai, K., et al., "Planar Multilevel Interconnection Technology," IEEE J. of Solid-State Circuits, vol. SC-13, No. 4, Aug. 1978, pp. 462–467.
IBM Technical Bulletin, Protective Coating for Devices on encapsulated modules, vol. 8 No. 12, May 1966, p. 1705.

*Primary Examiner*—Andrew J. James
*Assistant Examiner*—Sara W. Crane
*Attorney, Agent, or Firm*—Marvin Snyder; James C. Davis, Jr.

[57] ABSTRACT

Semiconductor chips are protected from handling damage by formation of a polymer dielectric layer at least 2 microns thick on the chip surface before dicing or shortly after dicing. The polymer dielectric layer may be a thermoplastic material or a thermoset material.

4 Claims, 9 Drawing Sheets

SEMICONDUCTOR CHIP PROTECTION LAYER AND PROTECTED CHIP

This application is a continuation of application Ser. No. 07/374,889 filed Jul. 3, 1989 now abandoned.

BACKGROUND OF THE INVENTION

1. Field of the Invention

The present invention relates to the field of semiconductor circuits, and more particularly, to the field of protecting semiconductor circuits from handling damage.

2. Background Information

Semiconductor device chips, and especially integrated circuit chips, are subject to damage during handling prior to packaging. Such integrated circuits contain many thin metallization layers exposed at the surface of the chip for subsequent connection of electrical leads during packaging and thin dielectric protective layers. These conductors and passivation layers on the chip are both subject to impairment or destruction by abrasion, scratching or contamination during handling or during the packaging process. A vast number of semiconductor die are handled mechanically one or more times between the time the wafer in which they were formed is diced into individual chips and the time the chip is finally sealed in a package, whether that package be hermetic (gas-tight) or non-hermetic (gas-permeable). Some of this mechanical handling is done by gripping the edges of the chip. In other cases, it is done by vacuum pick up of the patterned upper surface of the chip. Such mechanical handling results in a certain amount of chip damage even with the most carefully designed and cushioned handling equipment. Further, as the feature size of structures in the integrated circuits become smaller, the problem of damage increases. Contact with a technician's hand, tools and so forth, can also damage these chips because of the static charge, chemicals, oils, acids and other materials thereon.

It is old in the art to disposed a "laser guard" layer on a wafer prior to dicing the wafer into individual chips or dice using laser scribing or cutting. The purpose of this layer is to prevent hot debris from the laser cutting operation from landing on and damaging or adhering to the chips. Following dicing, the laser guard material is dissolved from the chips and carries any debris with it. A laser guard layer must be removed in order to serve its purpose of carrying the debris away. Further, if the laser guard material were left on the die, the 150° C. die attach temperatures would result in it crosslinking and becoming permanently bonded to the chip or die. This would create problems because laser guard materials (and photoresists) have insufficient thermal stability to survive such processes and would degrade, outgas and so forth, are not removable after crosslinking from such heat treatment without damaging the chip and would create reliability concerns.

Where chips are packaged in accordance with the high density interconnect (HDI) structure of the general type disclosed in U.S. Pat. No. 4,783,695 entitled "Multichip Integrated Circuit Packaging Configuration and Method" by C. W. Eichelberger et al., which is incorporated herein by reference, a certain amount of force is applied to the upper surface of the chip in bonding the chip to the substrate of the packaging structure. This is a potential source of contamination and deterioration of the integrated circuits.

As the feature size of chips continues to shrink, the problem of dust and other microscopic particles disposed on the chip surface can become a significant source of damage to the chips, even in the high density interconnect structure where a layer of polyimide is bonded to the chip surface by an adhesive layer, since the polyimide layer applies a downward pressure on the dust or other particle and is subject to stretching during the bonding process in a manner which can cause the dust particle to move across the chip surface thereby scratching it.

Where a chip which has been packaged in accordance with the high density interconnect structure of U.S. Pat. No. 4,783,695, has to have the interconnect structure removed because another chip in the system is defective or because of a defective wiring structure, the surface of the chip can be subject to significant forces if the adhesive layer attaching the interconnect structure to the chip surface is not sufficiently fluid to eliminate such forces.

For all these reasons, there is a need for an improved technique for protecting semiconductor chips during pre-packaging handling.

OBJECTS OF THE INVENTION

Accordingly, a primary object of the present invention is to provide a semiconductor chip protection structure which protects the chip from handling damage.

Another object of the present invention is to provide a semiconductor chip protection layer on the upper surface of the chip which may be deposited in liquid form.

Another object of the present invention is to provide a chip protection layer which has sufficient thermal stability to be left on the chip even after packaging.

Still another object of the present invention is to provide a chip protection layer which may be removed after mounting the chip in a package, but prior to connecting leads to individual contact pads on the integrated circuit.

A further objective is to provide a chip protection layer which may be applied prior to wafer dicing and remain on the chips until after the chips are mounted in packages.

SUMMARY OF THE INVENTION

The above and other objects which will become apparent from the specification as a whole, including the drawings, are accomplished in accordance with a preferred embodiment of the present invention by forming a non-movable, thick, polymer dielectric layer on the upper surface of the chip. This dielectric layer may be formed either on individual chips or on a wafer prior to dicing into individual chips. The composition of this protective layer may be selected either to make the layer non-removable during normal processing of semiconductor devices or to make it removable after mounting of the chip in a package prior to sealing that package. This protective layer is made thick enough to encapsulate expected dust particles and hold them immobile with respect to the chip surface to thereby prevent those particles from scratching the chip surface.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
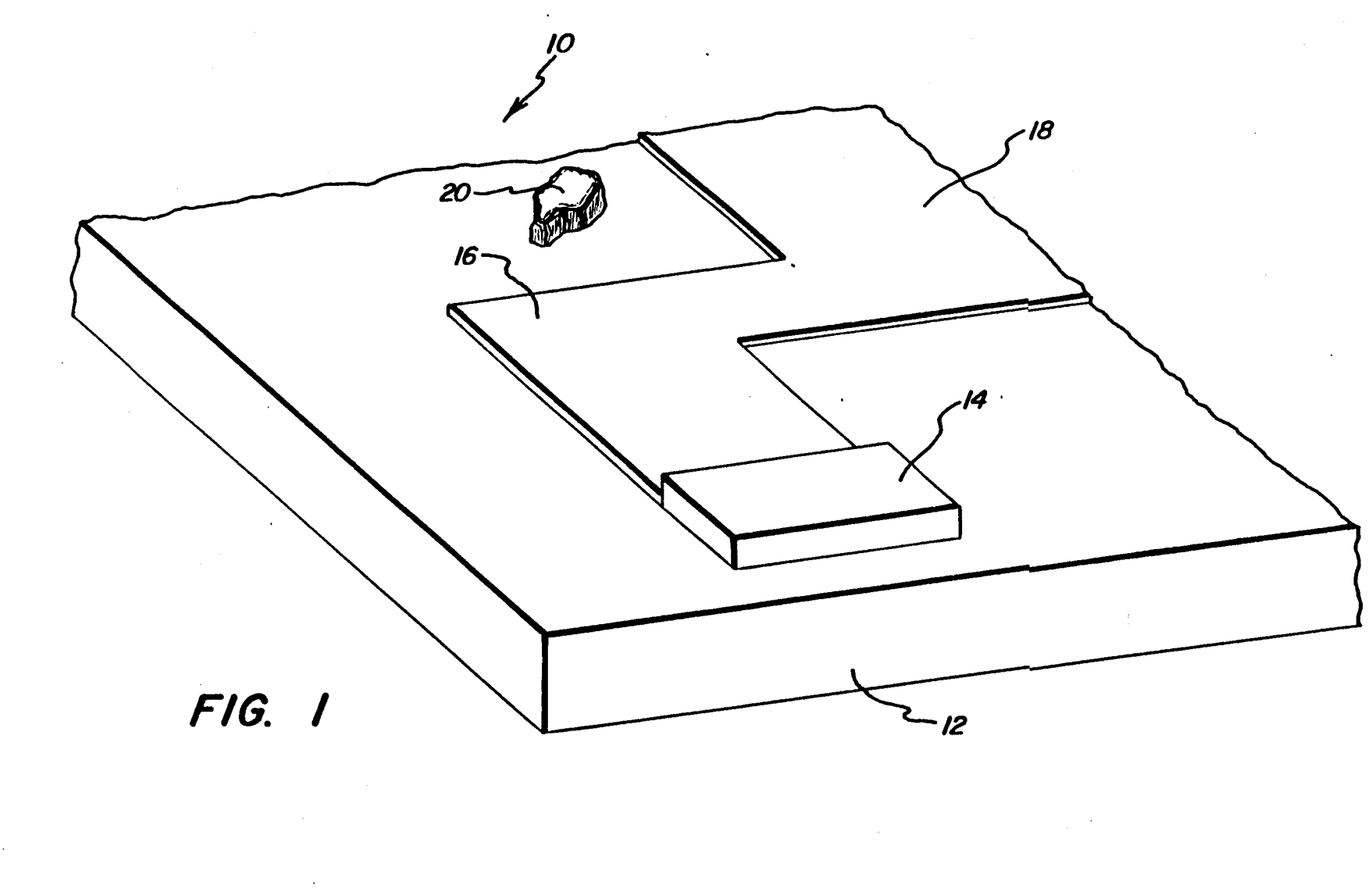
FIG. 1 illustrates a portion of a semiconductor chip along with a dust particle.

In FIG. 1, a portion of a semiconductor chip 10 is shown in a perspective schematic view. The semiconductor chip 10 comprises a body 12 of semiconductor material having a contact pad 14, a conductor 16 and a semiconductor region electrode 18 disposed on the upper surface thereof. Also shown on the upper surface of the semiconductor body 12 is a particle of dust or other foreign matter 20. The conductive run 16 is extremely narrow and delicate, but is normally covered by a layer of passivation such as deposited glass or silicon dioxide. The semiconductor region electrode 18 is also normally covered by such a passivation layer. The contact pad 14 is normally exposed and is substantially thicker and more rugged than the conductors 16 and 18, but is still extremely fragile. The particle 20 of foreign matter is typically on the order of 1 micron or so in diameter. These foreign bodies are often substantially harder material than the conductors 14, 16 and 18. Scraping the foreign particle 20 across the surface of the chip can impair or destroy one of the conductors or can impair or destroy a portion of a dielectric layer, thereby rendering the device unusable or a latent reliability risk. Despite the use of clean rooms for the fabrication of semiconductor devices, dust particles and other foreign bodies are present on a significant number of semiconductor chips at the time of packaging. In some types of semiconductor chips, such as microwave chips, it is standard practice in the art to avoid depositing a glass or silicon dioxide passivation layer on top of metallization because the high dielectric constants of those passivation materials adversely effect device operation. Consequently, in such circuits, the metallization is unprotected and extremely vulnerable to damage by foreign particles either scraping across the metallization or even just being pressed into the metallization during a subsequent fabrication step. That fabrication step may be merely the lamination of a dielectric layer of a high density interconnect system on top of the chip.

Also, a number of semiconductor chips are subject to failure as a result of being touched by a technician's hand as a result of static charge, chemicals, oils, acids, etc. which are present on the surface of the technician's hand, even if it is freshly washed.

In accordance with the present invention, the risks of damage due to dust and other foreign matter particles on a chip or from being touched by a technician is minimized by forming a polymer layer on the upper surface of the chip either prior to wafer dicing or shortly thereafter. At present, this must be done on individual chips because of a reluctance on the part of chip suppliers to apply such layers to wafers prior to dicing. Where the layer is applied prior to dicing, the dicing should be done with a saw. This polymer layer should preferably have a thickness in the range from about 2 microns to about 10 microns in order to encapsulate any dust or other foreign matter particles such as the particle 20 and to protect the chip from subsequently encountered foreign particles or objects and from contact with a technician's hand. This polymer layer is preferably formed by deposition on the chip of a solvent solution of a desired polymer material. Such materials include polyetherimides available from General Electric under the tradename Ultem® 1000 and 6000 and various polymer materials such as Udel 1700® polysulfone available from Union Carbide, and polyimides XU 218® and 412® available from Ciba Giegy and Amoco AI-10 or Pyre-Ml® available from du Pont de Nemours and so forth. These materials are thermally stable and radiation hard. Other materials may also be used provided they exhibit sufficient thermal stability and radiation hardness for the intended application. Different solvents are appropriate to different ones of these materials. Two different types of materials are included in this list. Ultem 1000, Ultem 6000, Udel 1700 and XU 218 are thermoplastic materials. By thermoplastic materials, we mean materials whose characteristics depend on their present temperature, and only insignificantly on their past thermal history in the sense that the material's characteristics at a given temperature may be accurately predicted without any other knowledge of its thermal history. Materials like Ciba Giegy 412 and Amoco AI-10 are thermoset materials by which we mean materials whose characteristics at a given temperature are a strong function of the past thermal or other activation history in that at a particular temperature, or in the case of Ciba Giegy 412 which is photosensitive, as a result of thermal history or particular photoexposure, the material crosslinks and changes characteristics substantially with the result that the material's characteristics are substantially different after crosslinking than they were prior to crosslinking.

Figure 2:
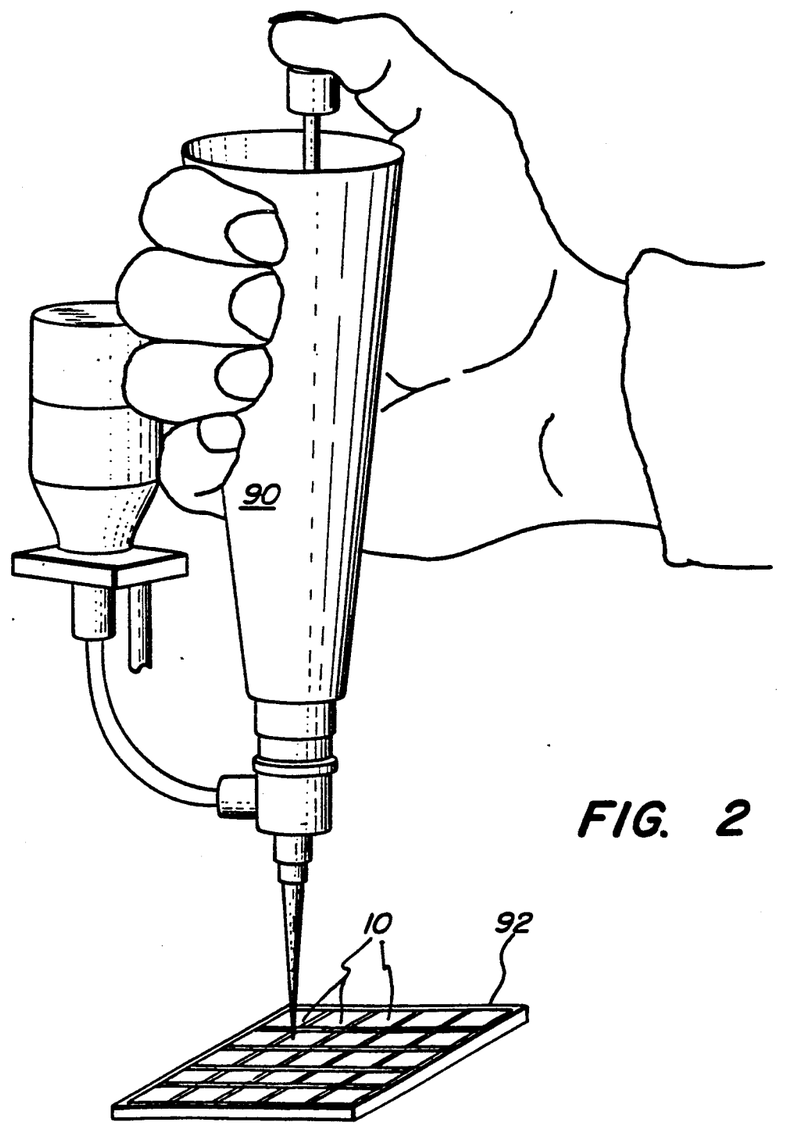
FIG. 2 illustrates a method of dispensing a solvent solution of a protective polymer onto semiconductor chips.

A solvent solution of the selected polymer material is deposited on the upper surface of the semiconductor chip and dried to form the polymer dielectric layer. A preferred material is Ciba Giegy 412 which is a photosensitive thermoset, polyimide of proprietary composition. The protective layer 40 on chips 10 may be formed in a efficient manner by depositing the source solution on individual chips which are stored in a chip tray with a dispensing pipette similar to that used to add materials to medical cultures, as shown schematically in FIG. 2 where a hand pipette 90 is shown dispensing the polymer source solution onto chips 10 held in an "egg crate" chip holder 92. This can be a fast, efficient deposition process and where the chip carrier is made of material capable of surviving the drying temperature for the solvent solution without damage to the carrier or contamination of the chip, the entire process may be carried out without additional handling of the chips. Preferred materials for such a heatable egg crate are titanium and aluminum.

Figure 3:
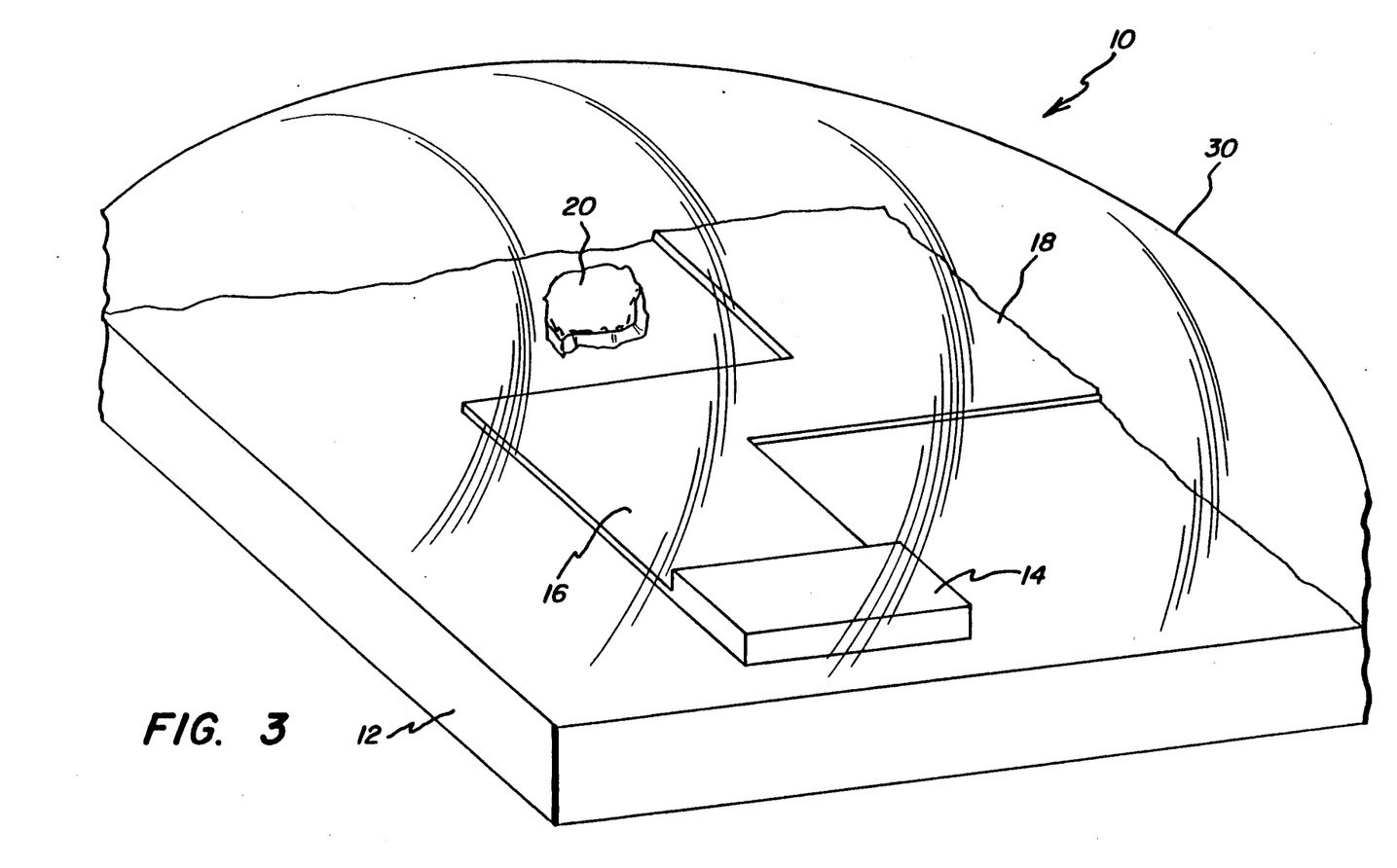
FIG. 3 illustrates the initial step in forming a protective layer on the chip of FIG. 1.
Figure 4:
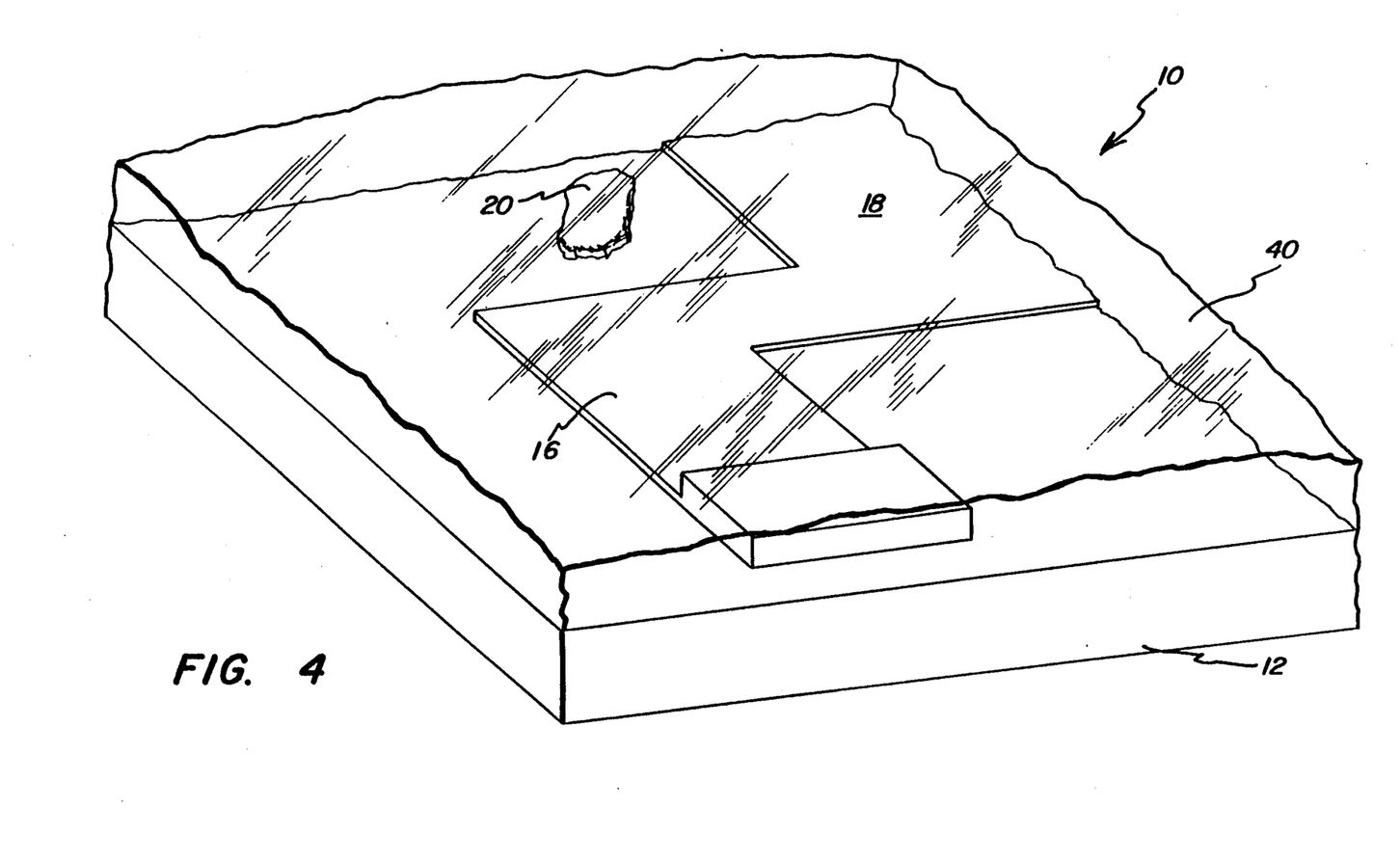
FIG. 4 illustrates the chip of FIG. 3 following completion of the protective layer formation process.
Figure 5:
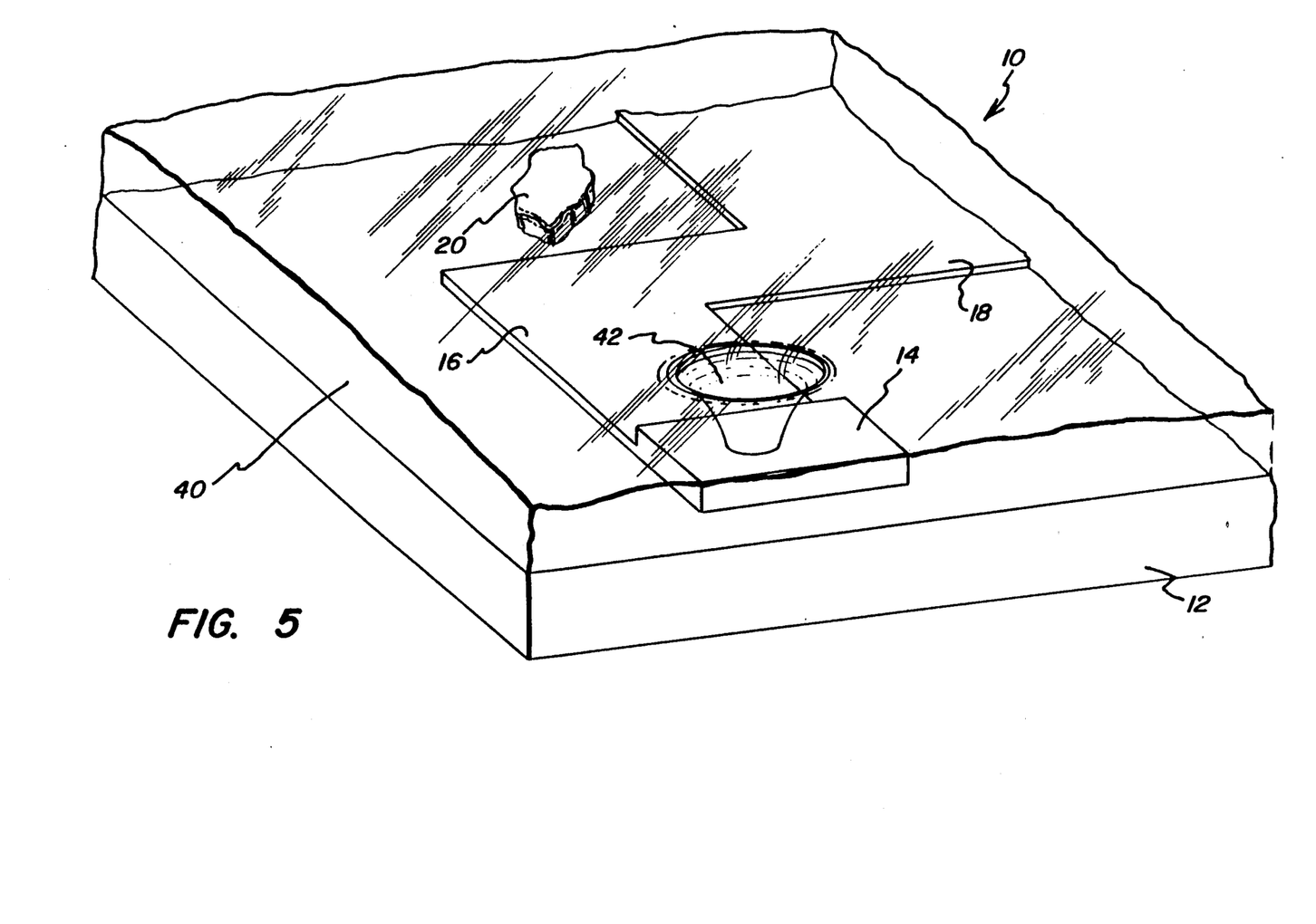
FIG. 5 illustrates the formation of a via hole in the protective layer as an initial step in connecting the protected chip into a larger structure.
Figure 6:
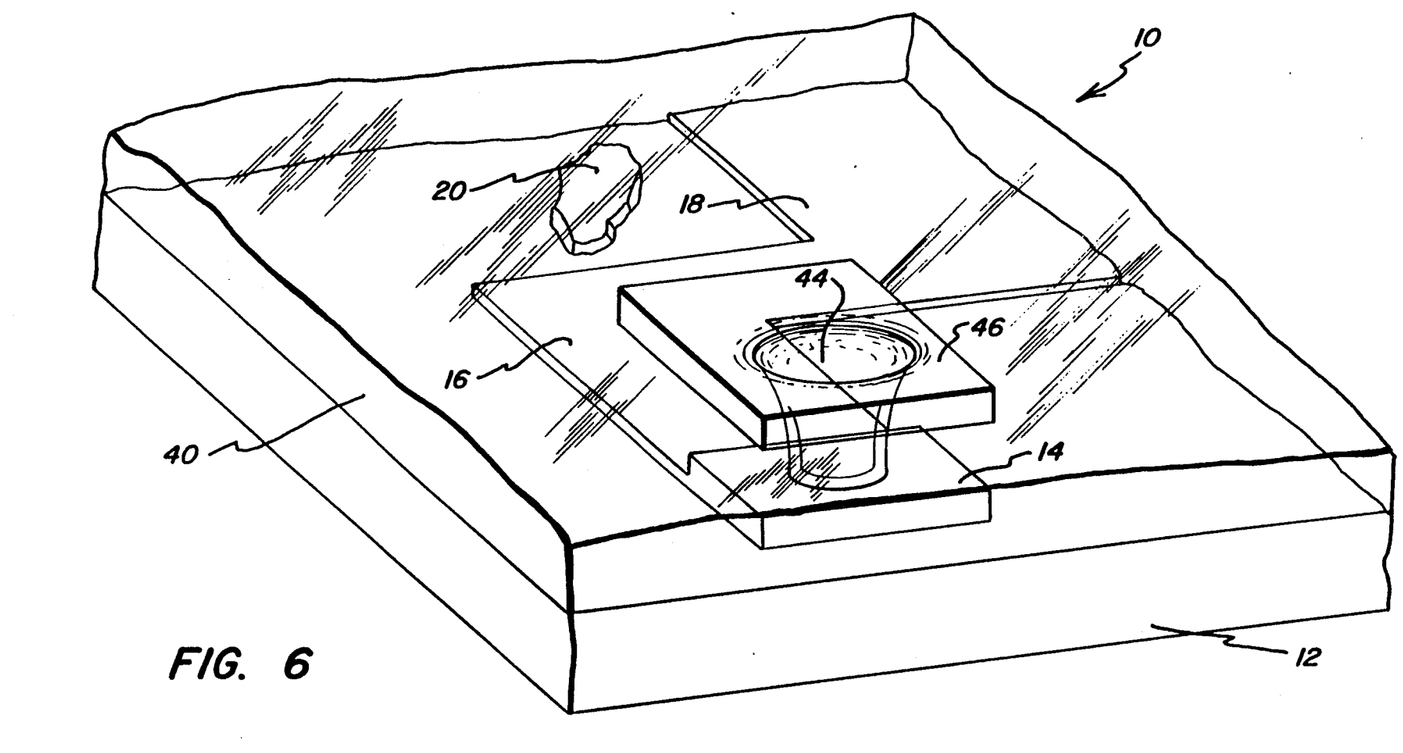
FIG. 6 illustrates a conductor on top of the protective layer which makes contact to a contact pad on the chip.
Figure 8:
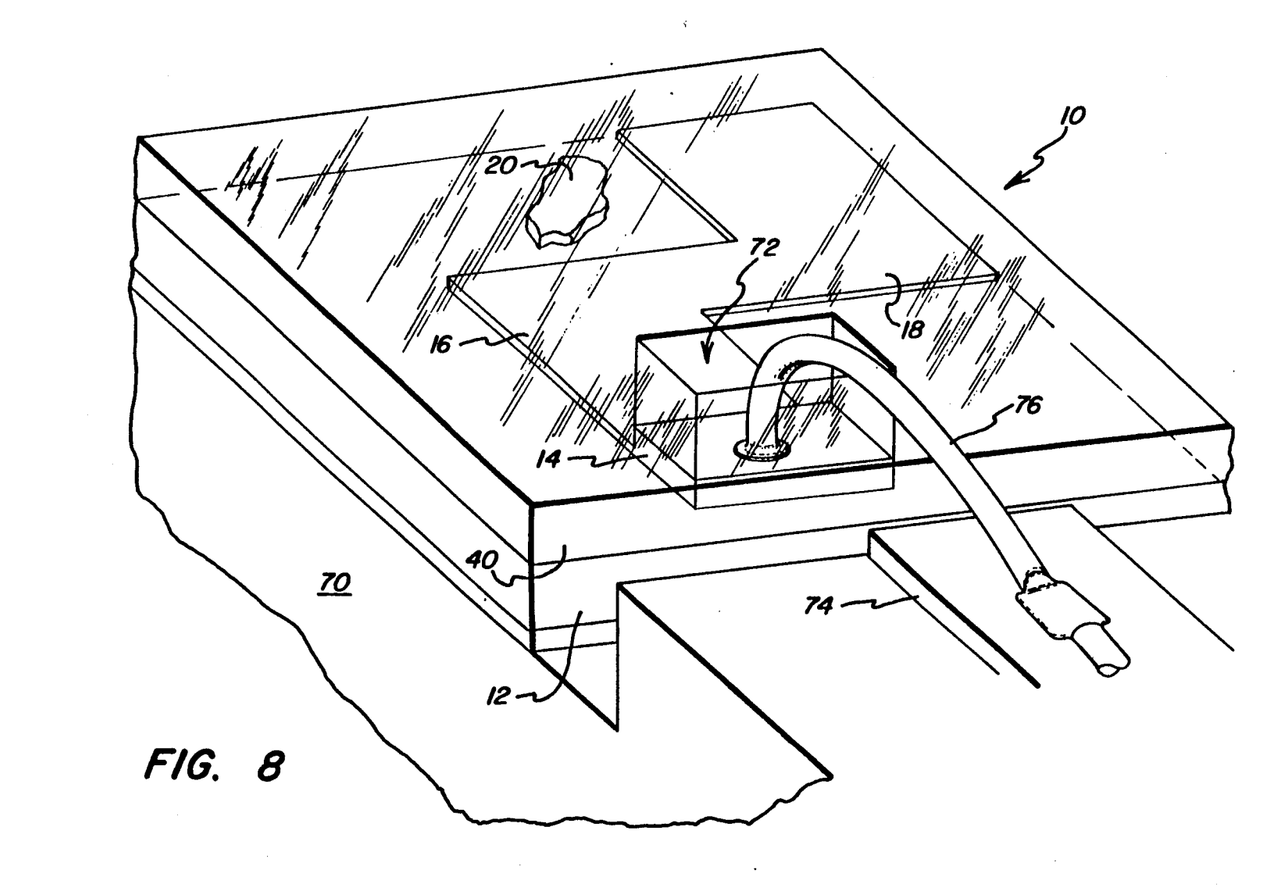
FIG. 8 illustrates the structure of FIG. 4 with a large via hole exposing a contact pad and having a wire bond connecting that contact pad to external circuitry.

This polymer material may preferably be deposited in a liquid form comprised of 24.8% by weight of the liquid 412 solution provided by Ciba Giegy, 66.4% by weight N-mp (N-methypyrollodone), 0.59% by weight of a 0.1% solution of Fc430 ® available from 3M (a surfactant) and 8.3% by weight DMAC (dimethyl acetamide). The N-mp provides this solution with a non-wetting attribute. This enables the solution to be deposited on the top surface of the semiconductor chip as shown in FIG. 3 in a manner in which the deposited liquid stands up on the chip, and does not wet or extend around onto the edges of the chip. Consequently, a droplet 30 of this material as much as about 20 mils thick may be deposited on the top of a chip. This material is then dried in a sequential thermal sequence of 10-20 minutes at 150° C., 10-20 minutes at 220° C. and 10-20 minutes at 300° C. This drying sequence removes the solvent from the droplet 30 and leaves a layer 40 (FIG. 4) of the 412 material which appears to be fully cross-linked and acts as a thermoset material in that it is no longer soluble in the solvent solution and does not soften except at extremely high temperatures. This material has a $T_g$ of approximately 360° C. and remains fixed without flowing at substantially higher temperatures than that. This dielectric layer has a substantially uniform composition throughout its thickness. This fully dried layer has a number of advantages. First, it protects the surface of the chip from direct abrasion, scratching and other damage due to contact of foreign bodies including humans with the upper surface of the chip. Further, the layer 40 may be removed from contact pads to form via holes 42 as illustrated in FIG. 5 or by forming larger holes 72 to expose a large portion or the entire surface of a contact pad 14 as shown in FIG. 8.

It should also be understood that the detailed technique for making openings in the dielectric film 40 is discretionary and does not form a part of this invention. For this purpose, the techniques described in U.S. Pat. No. 4,617,085 to Cole, Jr. et al. in which a pulsed laser is energized to generate openings in a dielectric film may be utilized. A wavelength of approximately 248 nanometers has been found to provide good results. Alternatively, the techniques of U.S. Pat. No. 4,714,516 to C. W. Eichelberger et al. and U.S. Pat. No. 4,764,485 to Loughran et al. may be employed to make openings in the dielectric film, as may the technique of copending, commonly assigned U.S. patent application Ser. No. 310,489, filed Feb. 14, 1989, entitled "Laser Beam Scanning Method for Forming Via Holes in Polymer Materials" by C. W. Eichelberger et al. The composition of the dielectric film, the type of laser and drilling technique are chosen to complement each other as described in the above-noted references, each of which is incorporated herein by reference.

Figure 9:
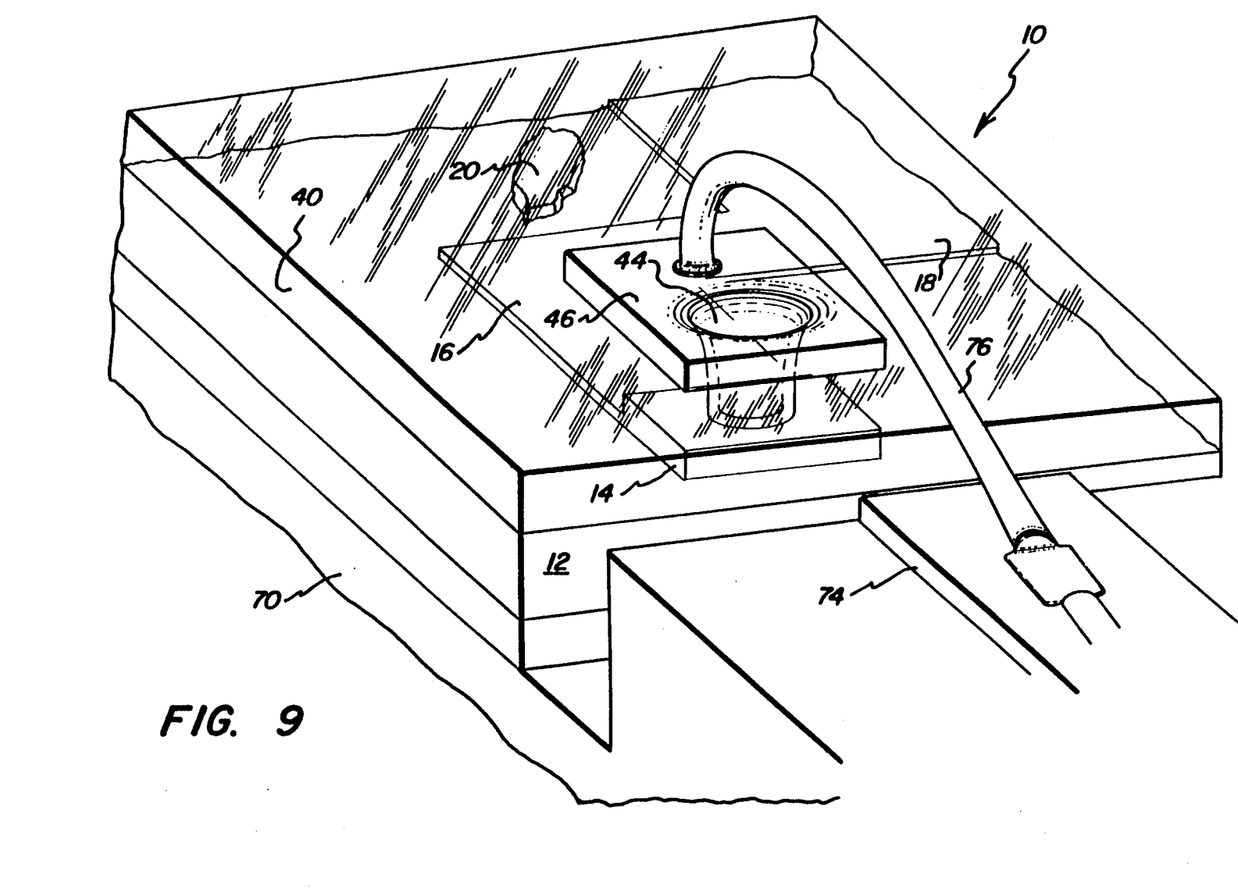
FIG. 9 illustrates the structure of FIG. 6 with a wire bond connected it to external circuitry.

If the process of U.S. Pat. No. 4,617,085 is chosen to make the openings in the dielectric film, a single step ablation of an opening through the film 40 is made. If the technique of U.S. Pat. No. 4,714,516 is employed, the laser is used in a two step process in which the first step is to sensitize the dielectric film 40 by use of the laser impinging on the appropriate areas, followed by an etching operation in which the openings are made by use of an appropriate reactive etching step. If the process of U.S. Pat. No. 4,764,485 is used, a metal film is formed over the dielectric as a mask, the metal film is then selectively ablated by the laser after which the dielectric exposed by the ablation of the metal is etched to create the holes. If the process of application Ser. No. 310,149 is used, a continuous wave (cw) laser is focused to a small, very high energy density spot and dithered laterally back and forth across the width of the desired opening while being translated in a perpendicular direction along the length of the desired opening to expose the entire area of the dielectric which is to be removed to form a hole. In any event, once this step is completed, appropriate openings will have been made through the dielectric film 40 which permit electrical connections to be made to the contact pads 14 on the chip 10. Where a via hole 42 (FIG. 5) is made directly in the layer 40, a connecting metal pattern 46 may then be formed on the upper surface of the layer 40 and in the via hole 42 to form via contacts 44 between the overlying metallization 46 and the underlying contact pad 14. This provides a pad which is suitable for wire bond connection to a package as shown in FIG. 9. This is particularly useful where the chip is to be temporarily mounted in a package for complete electrical testing after which it will be removed from that temporary package and mounted in a final permanent package. When the chip is removed from the temporary package, the bond wires can be pulled off the pads 46 without danger of harming the contact pads 14. For further information, see U.S. patent application Ser. No. 305,314, entitled "Integrated Circuit Test Structure and Test Process" by H. S. Cole et al., filed Feb. 3, 1989. This application is incorporated herein by reference.

Figure 7:
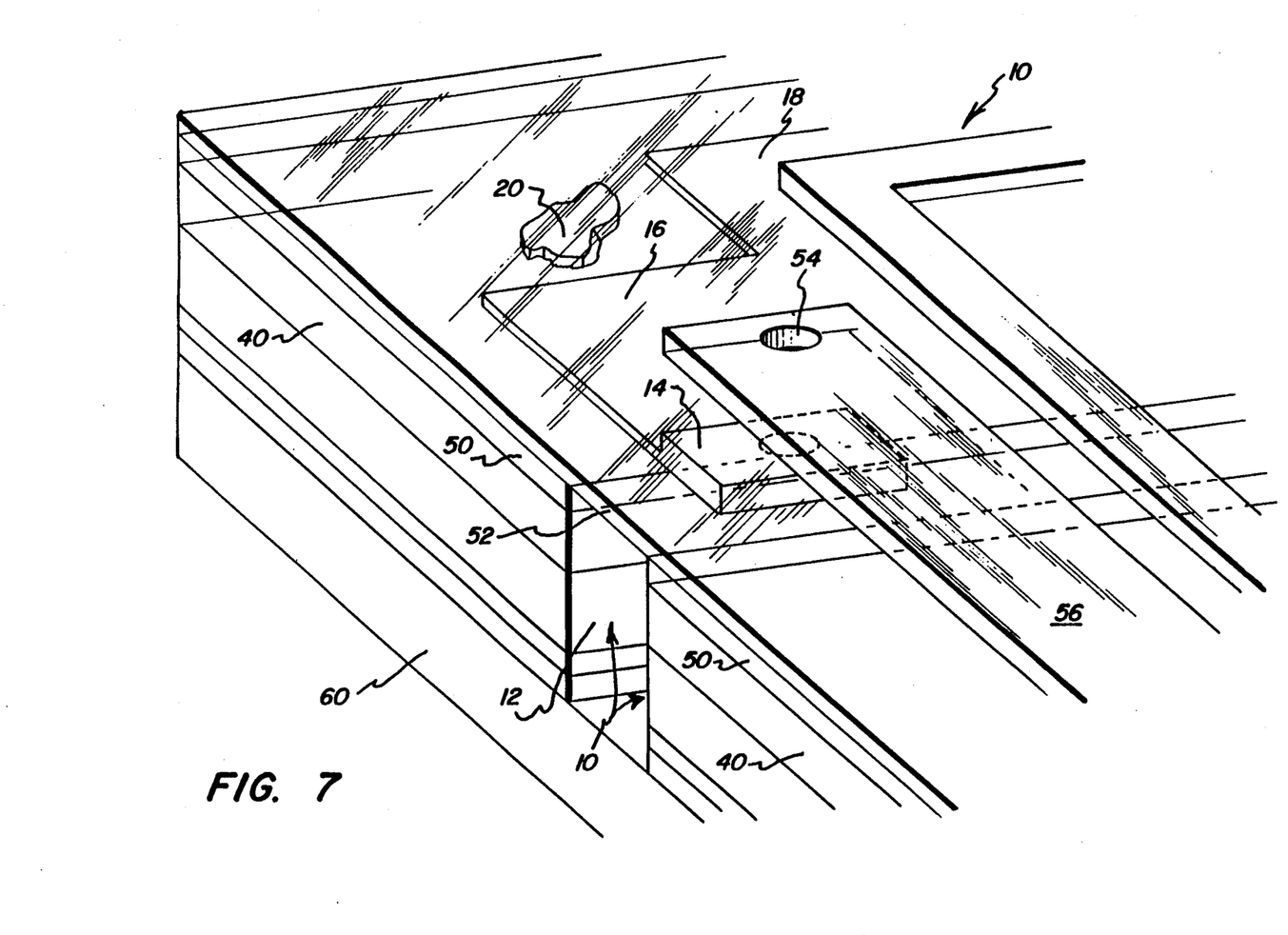
FIG. 7 illustrates the structure of FIG. 4 with a high density interconnect structure disposed thereon for connecting the chip to external circuitry.

Alternatively, as shown in FIG. 7, the integrated circuit chip may be mounted in a package or on a substrate 60 with other integrated circuit chips 10 to which it is to be connected or on which contact lands of external leads of the package are disposed. Thereafter, a polymer-adhesive layer 50 is disposed on the upper surface of the layer 40 of each of the integrated circuit chips and the exposed package surface having contact lands thereon. A dielectric film 52 is then laminated to the upper surface of the entire structure. Thereafter, via holes are formed in alignment with contact pads of the integrated circuits and the substrate or package to which contact is to be made. A metallization layer 56 is then formed on the upper surface of the dielectric layer 52 with via hole connections 54 extending down through the dielectric layers 52, 50 and 40 to the contact pads 14 of the integrated circuits and of the substrate. This manner of applying a high density interconnect (HDI) structure is explained in greater detail in. U.S. Pat. No. 4,783,695 to C. W. Eichelberger et al., which is incorporated herein by reference and copending application Ser. No 374,890, filed Jul. 3, 1989, by R. J. Wojnarowski et al. and entitled "Electronic Systems Disposed in a High Force Environment", which is incorporated herein by reference. With the high density interconnect (HDI) structure in place, the composition of the polymer dielectric on the chip surface varies with distance from the surface, but is still uniform for the entire thickness of the protective layer 40.

A substantial advantage of having the layer 40 a thermoset material which does not soften at the fabrication and repair temperatures for an HDI overlay system is the fact that the layer 40 remains on the chip surface and keeps any forces applied during the fabrication process, such as during the lamination of the film 52 onto the upper surface or such as during removal of the HDI overlayer for repair purposes, isolated from the chip by the layer 40.

It is our experience, in proposing this type of packaging system, that people in the semiconductor business are extremely leery of incorporating polymer materials inside device packages and are deeply concerned about polymer residues left on the contact pads by such removal processes.

Alternatively, where use of a high density interconnect system is not desired or is not feasible, the dielectric layer 40 may be removed from the surface of contact pads 14 in a manner to leave a large opening 72 which essentially exposes the entire upper surface of the contact pad for bonding in the desired manner. As shown in FIG. 8, this chip may be bonded in a package 70 and connected by wire bond wire 76 from the contact pad 14 to a land 74 of the package by thermocompression bonding or other appropriate techniques. Alternatively, where the metallization 14 is solderable, the contact may be made by depositing solder in the opening 72 and then using that solder to bond the chip to another structure, such as by flip-chip bonding. As a further alternative, the bond wire 76 can be bonded to the metallization 46 on top of layer 40 a shown in FIG. 9.

As an alternative to the use of the thermoset materials discussed above, one of the thermoplastic materials listed above or other thermoplastic materials may be used as a protective layer during chip handling and packaging. These thermoplastic materials provide the advantage that they may be removed by solvents after the chip is mounted in the package either prior to or subsequent to connection of wire bond leads to that chip. A preferred thermoplastic material for this application is XU 218 available from Ciba Giegy. A preferred solution for depositing this thermoplastic material on the upper surface of the wafer comprises 4.1% by weight of the liquid form of XU 218 which is available from Ciba Giegy; 2.5% by weight DMAC; 27.3% by weight anisole; and 66.1% by weight GBL (-γ-Butyrolactone). This material is deposited in the same manner and dried in the same manner as the 412 material. However, this material is removable by solvents such as GBL, N-mp, methylene chloride, acetophenone and so forth. Consequently, this layer may be left on the chip until the chip has been secured in a package and then removed through the use of one or more of these solvents to leave the chip in the same condition it would have been through use of the prior art method without the protective layer, other than the increase in yield of operative chips in the packages because of the protection of the chip from abrasion, scratching and so forth during handling between the time of wafer dicing and package mounting. The other materials maybe deposited using the same or similar solvent mixtures to those specified for the 412 and XU 218 materials.

While it is presently preferred to deposit the film on chips individually, because of the ability of the solvent solution to form a thick layer on the chip and the reluctance of vendors to do so before dicing, the protective layer may also be deposited on the chips in wafer form and the wafer diced by sawing after drying of the solvent solution to provide the desired polymer dielectric protection layer. This deposition prior to dicing has the advantage of providing surface protection during dicing and keeps dicing debris off the chip surface.

As used herein, the term "chip" refers to a single continuous piece of semiconductor material and the conductors, passivation and so forth disposed thereon. Such a chip may contain a plurality of structures each of which was designed and configured to be separated into individual chips during wafer dicing, but which have not, in fact, been separated by dicing. This is advantageous where a system benefits from having various segments in substantially the same environment, such as temperature and so forth.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In combination:
    a semiconductor chip having external contact pads on a first surface thereof;
    a first polymer dielectric layer at least 2 microns thick disposed on and adhered to substantially all of said first surface of said chip, including said external contact pads,
    a second polymer layer disposed on said first polymer layer; and
    a third polymer layer disposed on said second polymer layer;
    said first polymer layer being a thermoset material and said second polymer layer being a thermoplastic material.

2. The combination recited in claim 1 further comprising:
    a metallization pattern disposed on said third polymer layer and connected to selected ones of said external contacts on said semiconductor chip through metallization disposed in via holes in said polymer layers.

3. The combination recited in claim 2 wherein:
    a single via hole extends through said third, second and first recited polymer layers to one of said external contact pads.

4. The combination recited in claim 2 wherein:
    said first recited polymer layer has a second metallization pattern disposed thereon and connected to said external contact pads by metallization disposed in first via holes through said first recited polymer layer; and
    the first recited metallization pattern extends into via holes in said second and third polymer layers and into contact with said second metallization pattern.

* * * * *